(12) United States Patent
Zhang et al.

(10) Patent No.: US 9,058,986 B2
(45) Date of Patent: Jun. 16, 2015

(54) DUAL-GATE FINFET

(75) Inventors: Shengdong Zhang, Shenzhen (CN); Ruqi Han, Shenzhen (CN); Dedong Han, Shenzhen (CN)

(73) Assignee: PEKING UNIVERSITY SHENZHEN GRADUATE SCHOOL, Shenzhen, Guangdong (CN)

( * ) Notice: Subject to any disclaimer, the term of this patent is extended or adjusted under 35 U.S.C. 154(b) by 6 days.

(21) Appl. No.: 13/376,835

(22) PCT Filed: Jun. 13, 2011

(86) PCT No.: PCT/CN2011/075646
§ 371 (c)(1),
(2), (4) Date: Nov. 18, 2013

(87) PCT Pub. No.: WO2012/092752
PCT Pub. Date: Jul. 12, 2012

(65) Prior Publication Data
US 2014/0065779 A1     Mar. 6, 2014

(30) Foreign Application Priority Data
Jan. 5, 2011 (CN) .......................... 2011 1 0001128

(51) Int. Cl.
H01L 21/336    (2006.01)
H01L 21/02     (2006.01)
H01L 29/66     (2006.01)

(52) U.S. Cl.
CPC .... H01L 21/02488 (2013.01); H01L 29/66795 (2013.01); H01L 21/02592 (2013.01)

(58) Field of Classification Search
CPC . H01L 27/1211; H01L 21/00; H01L 21/8238; H01L 21/84; H01L 21/02488
USPC ......... 257/347; 438/149, 151, 156, 157, 212, 438/283
See application file for complete search history.

(56) References Cited

U.S. PATENT DOCUMENTS

| 6,635,924 B1 | 10/2003 | Hergenrother et al. | |
| 2008/0111185 A1* | 5/2008 | Cheng | 257/347 |
| 2008/0171408 A1* | 7/2008 | Zhu et al. | 438/157 |

OTHER PUBLICATIONS

Choi et. al, "Spacer FinFET: nanoscale double-gate CMOS technology for the terabit era", Oct. 2002, Journal of Solid-State Electronics, vol. 46, Iss. 10, p. 1595-1601.*
Han et. el, "A simple nano-scale patterning technology for FinFET fabrication", Oct. 2008, Solid-State and Integrated-Circuit Technology, 2008. ICSICT 2008. 9th International Conference , p. 1340-1342.*

* cited by examiner

Primary Examiner — Selim Ahmed
Assistant Examiner — Changhyun Yi
(74) Attorney, Agent, or Firm — Perkins Coie LLP

(57) ABSTRACT

Designs and fabrication of a FinFET are provided. In one implementation, the fabrication can include forming a dielectric stripe on a substrate; implanting ions to the substrate by using the dielectric stripe as a mask so as to convert a surface layer of the substrate to an amorphous layer; forming an amorphous semiconductor layer on the substrate covering the dielectric stripe and recrystallizing each of the amorphous layer and the amorphous semiconductor layer to be a monocrystalline layer; processing regions beside two ends of the dielectric stripe to form a protective layer, the regions being predesigned as source and drain regions; forming recrystallized semiconductor spacers at two sides of the dielectric stripe uncovered by the protective layer, and forming recrystallized semiconductor blocks on regions covered by the protective layer; removing the dielectric stripe between the spacers so that the spacers can be formed as Fin bodies.

12 Claims, 7 Drawing Sheets

DUAL-GATE FINFET

CROSS REFERENCE TO RELATED APPLICATIONS

This application is a 35 USC §371 National Stage application of, and claims priority of, International Application No. PCT/CN2011/075646 filed Jun. 13, 2011, which further claims the benefit and priority to China Patent Application No. 201110001128.6 filed Jan. 5, 2011. The disclosure of each of the prior applications is considered part of and is incorporated by reference in the disclosure of this application.

TECHNICAL FIELD

The present invention relates to semiconductor integrated circuits and manufacture technology thereof, and more particularly, to a method for manufacturing a fin field effect transistor (FinFET).

BACKGROUND

The performance of an integrated circuit device is improved mainly by minimizing its size and improving its operation speed. Currently, the characteristic size of the integrated circuit device (such as a MOSFET) has been minimized to be in a nano-scale. Under such a nano-scale, however, some limitations in principle and practice are raised, which impact the application of the integrated circuit technology based on the silicon planar CMOS technology. Generally, it is acknowledged that the CMOS technology has a chance to be used for the 20 nm-scale even 10 nm-scale. However, when used for a scale less than 20 nm, the conventional planar CMOS technology encounters many problems. In recent years, the multi-gate MOS technology among various new technologies has widely been researched and deemed as the most desirable technology for the use in the scale less than 20 nm, since the multi-gate device may be stronger for inhibiting the short channel, have better sub-threshold characteristic and higher driving ability, and may result in a denser circuit, in comparison with the conventional single-gate device.

Currently, a FinFET device is the most desirable multi-gate device, since its self-aligned structure can be made by the conventional planar CMOS process. The FinFET device may include a dual-gate FinFET and a tri-gate FinFET. On the one hand, the thickness of a Fin of the dual-gate FinFET is required to be ⅓-½ of the length of the gate electrode in order to obtain an acceptable performance, which results in a big challenge to the fine processing. On the other hand, three faces of a Fin of the tri-gate FinFET are all controlled by the gate electrode. Thus, the tri-gate FinFET should have a strong ability of inhibiting the short channel. Accordingly, its Fin may have a thickness equal to or longer than the length of the gate electrode. That is, the (smallest) characteristic size of such a device is still the length of the gate electrode, which will not result in a problem to the fine processing. Thus, this technology would be more compatible with the conventional CMOS process. However, in practice and principle, a tri-gate FinFET with a heavy-droped channel has exhibited a desired performance in short channel, but a tri-gate FinFET with a light-droped or un-droped channel is not significantly better than the dual-gate FinFET. In the nano-scale, the MOS device should not take a heavy-droped channel in order to avoid discrete threshold voltage caused by the discrete impurity volume. That is, the channel of the MOS device should be light-droped or un-droped. In addition, with the same area of the channel, a tri-gate device occupies more area than a dual-gate device even than a single-gate device. As a result, the dual-gate FinFET device may be more desirable.

From the above, although the dual-gate FinFET device may be more desirable than the tri-gate FinFET device, some technical problems should be solved before the application thereof. A main problem to be solved is the processing for the ultra-thin Fin body. None of the reported fabricating technologies can be used for mass production. Generally, the Fin body is made by photolithography together with another subsequent technique, such as ashing to the etched pattern, in order to minimize the size of the pattern. However, such a technique cannot be used to manufacture circuits due to its bad uniformity and repeatability. Another possible choice is the spacer image transfer technique, which is a simple nano-scale processing technique and can be used to manufacture a single device. However, this technique may result in many parasitic patterns and therefore is not adaptable to manufacture circuits.

SUMMARY

The present invention is to provide a method for manufacturing a FinFET. The thickness of a Fin body made by using the method may satisfy the requirements of various FinFETs. For example, where a dual-gate FinFET is manufactured by using the method, the thickness of the Fin body of the manufactured FinFET may be ⅓-½ of the length of the gate electrode or shorter.

An embodiment of the invention provides a method for manufacturing a FinFET, comprising:

forming a dielectric stripe on a substrate;

implanting ions to the substrate by using the dielectric stripe as a mask so as to convert a surface layer of the substrate from a monocrystalline material to an amorphous layer;

forming an amorphous semiconductor layer on the substrate, which covers the dielectric stripe, and then recrystallizing each of the amorphous layer and the amorphous semiconductor layer to be a monocrystalline layer by thermal annealing;

processing regions beside two ends of the dielectric stripe to form a protective layer, the regions being predesigned as source and drain regions;

forming recrystallized semiconductor spacers at two sides of the dielectric stripe uncovered by the protective layer, and forming recrystallized semiconductor blocks on regions covered by the protective layer;

removing the dielectric stripe between the spacers so that the spacers can be formed as Fin bodies, the semiconductor blocks being support blocks on two sides of the Fin bodies and the support blocks being the source and drain regions of the transistor;

forming a sacrificial layer on the substrate and the semiconductor blocks, forming protective spacers on two sides of each Fin body, and then isolating the Fin bodies from the substrate by oxidizing; and removing the protective spacers and forming a gate dielectric layer and a gate electrode.

In an embodiment, the substrate is an un-doped or light-doped monocrystalline semiconductor substrate.

In an embodiment, the semiconductor spacers are formed by anisotropically etching the recrystallized semiconductor layer so as to form the recrystallized semiconductor spacers at two sides of the dielectric stripe uncovered by the protective layer.

In an embodiment, the sacrificial layer formed on the surface covers the Fin bodies, and the method further comprises removing the sacrificial layer on two sides of each Fin body after the step of removing the protective spacers.

In an embodiment, the step of isolating the Fin bodies from the substrate comprises forming an isolation layer at the bottom of each Fin body by lateral oxidation so as to isolate the Fin bodies from the substrate.

In an embodiment, the step of processing regions beside two ends of the dielectric stripe to form a protective layer comprises covering a photoresist onto the regions beside two ends of the dielectric stripe, which are predesigned as source and drain regions.

In an embodiment, the annealing is performed in an oxygen free environment for a time of 1 hour-8 hours at a temperature of 600° C.-900° C.

In an embodiment, the method further comprises forming a shield layer on the substrate, after the step of forming a dielectric stripe on a substrate and before the step of implanting impurity ions.

In an embodiment, the dielectric stripe is a silicon oxide stripe and the amorphous semiconductor layer is an amorphous silicons layer.

Another embodiment of the present invention provides a method for manufacturing a FinFET, comprising:

forming a dielectric stripe on a substrate;

forming an amorphous semiconductor layer on the substrate, which covers the dielectric stripe;

implanting ions to the substrate by using the dielectric stripe as a mask so as to form an amorphous layer on the substrate, and then recrystallizing each of the amorphous layer and the amorphous semiconductor layer to be a monocrystalline layer by thermal annealing;

processing regions beside two ends of the dielectric stripe to form a protective layer, the regions being predesigned as source and drain regions;

forming recrystallized semiconductor spacers at two sides of the dielectric stripe uncovered by the protective layer, and forming recrystallized semiconductor blocks on regions covered by the protective layer;

removing the dielectric stripe between the spacers so that the spacers can be formed as Fin bodies, the semiconductor blocks being support blocks on two sides of the Fin bodies and the support blocks being the source and drain regions of the transistor;

forming a sacrificial layer on the substrate and the semiconductor blocks, forming protective spacers on two sides of each Fin body, and then isolating the Fin bodies from the substrate by oxidizing; and removing the protective spacers and forming a gate dielectric layer and a gate electrode.

The thickness of the Fin body made by using the method of the present invention is determined by the deposition process but not restricted by the photolithography and etching. In theory, the thickness of the Fin body made by using the method may satisfy the requirements of various FinFETs. Especially, the method is suitable for manufacturing the transistor which needs a fine Fin body. Furthermore, the uniformity of the thickness and morphology of the formed Fin body can be improved significantly. The method may fully compatible with mainstream COMS technology, without restrictions of the photolithography and etching.

BRIEF DESCRIPTION OF THE DRAWINGS

The appended drawings show steps according to the present invention, respectively, wherein.

DETAILED DESCRIPTION OF EMBODIMENTS

According to FinFETs and methods for manufacturing the Fin body of the FinFETs of embodiments of the present invention, the Fin body is formed by a deposition process. The Fin body has a thickness without taking the restriction of photolithography and etching. The Fin body may be formed to have a thickness satisfying the requirements of various FinFETs. Furthermore, the uniformity of the thickness and morphology of the Fin body formed via such a process can be improved significantly. Hereinafter, a detailed description of embodiments of the present invention will be given with reference to the appended drawings.

Embodiment 1

Figure 1:
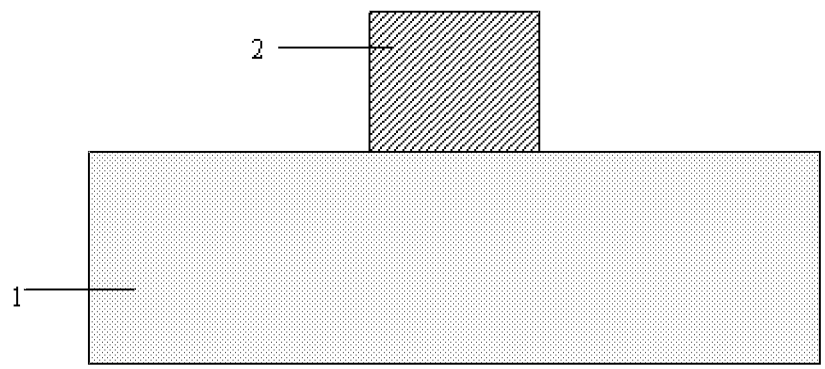
FIG. 1 shows a step of forming a dielectric stripe according to an embodiment of the present invention.

Referring to FIG. 1, a dielectric layer, which may be a silicon oxide layer and have a thickness of 100 nm-300 nm, is formed on a substrate 1. The dielectric layer may be formed by conventional thermal oxidation, chemical vapor deposition (CVD), physical vapor deposition (PVD) and the like. Then, the dielectric layer is processed to form a dielectric strip. For example, the dielectric layer may be processed by photolithography and dry-etching so as to form a silicon oxide strip 2. The thickness of the silicon oxide strip 2 may be much lager than the length of a gate electrode without needing any specific fine processing. The substrate 1 in the embodiment may be made of a silicon wafer or a monocrystalline material. According to the present invention, a substitute of an equivalent can be taken by the skilled in the art for the silicon oxide stripe 2 of the embodiment. In addition, another process other than the photolithography and dry-etching can be used for forming the silicon oxide stripe 2.

Figure 2:
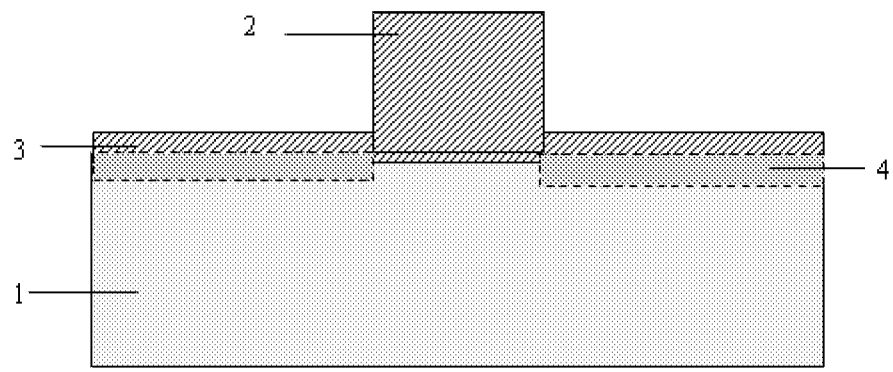
FIG. 2 shows a step of forming a thin film layer and implanting ions to form an amorphous layer according to an embodiment of the present invention.

Referring to FIG. 2, a thin film layer, which may be a silicon oxide layer 3 and have a thickness of 10 nm-30 nm, is formed on the substrate 1. The thin film layer may be formed by one of conventional thermal oxidation, chemical vapor deposition (CVD), and physical vapor deposition (PVD). Then, by using the silicon oxide stripe 2 as a mask, ions corresponding to the substrate material are implanted so that an amorphous layer 4 is formed at the surface of the substrate 1. In the embodiment, the ions for implantation may be silicon ions or germanium ions. In particular, silicon or germanium ions with a concentration of $1 \times 10^{15}$ cm$^{-2}$ and an energy of 20-30 keV, are implanted into the regions beside the silicon oxide stripe 2 to form the amorphous layer 4 on the surface of the silicon wafer 1.

Figure 3:
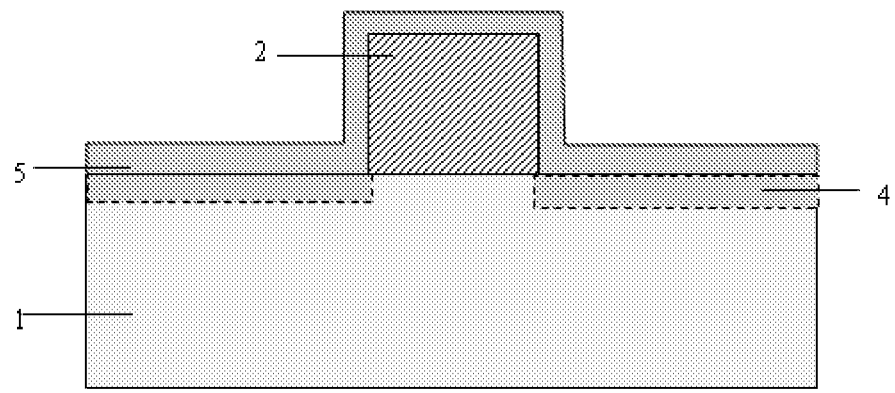
FIG. 3 shows a step of removing the thin film layer and forming an amorphous semiconductor layer according to an embodiment of the present invention.

Referring to FIG. 3, the silicon oxide layer 3 is corroded off by using a solution of buffered HF (BOE), and an amorphous semiconductor layer covering the silicon oxide stripe 2 is formed on the substrate 1. In the example of FIG. 3, the amorphous semiconductor layer refers to an amorphous silicon layer 5. It should be appreciated by the skilled in the art that the amorphous semiconductor layer may be made of others. The amorphous silicon layer 5 may be formed by low pressure chemical vapor deposition (LPCVD).

Figure 4:
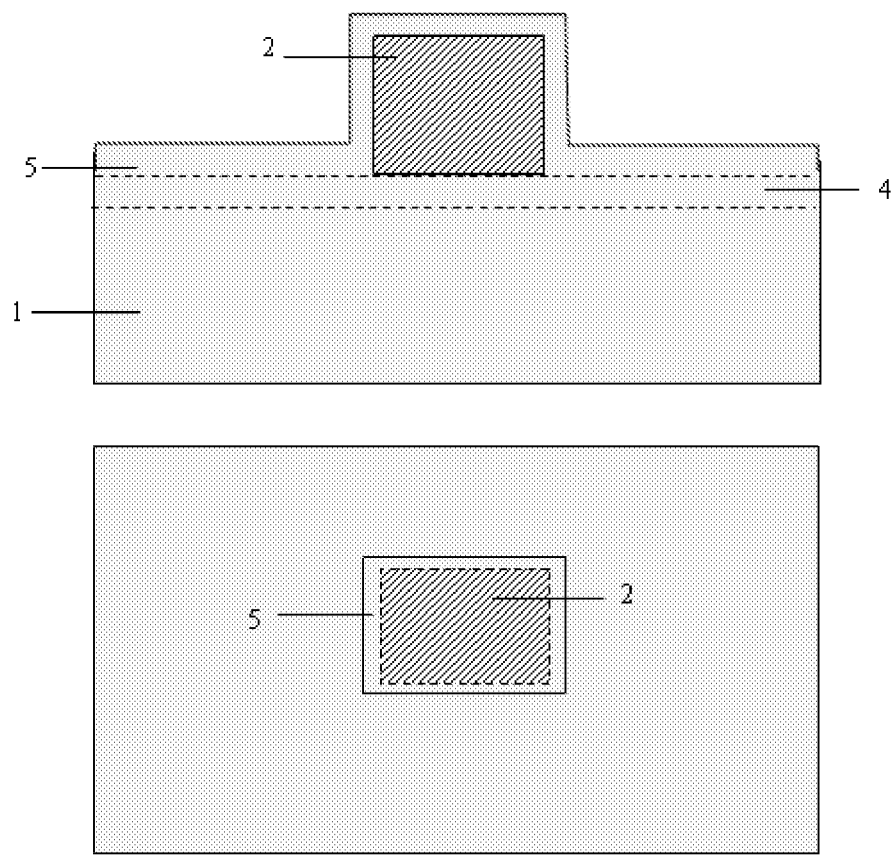
FIG. 4 shows a step of recrystallizing the amorphous layer and the amorphous semiconductor layer to form a monocrystalline layer according to an embodiment of the present invention.

Referring to FIG. 4, the formed amorphous layer 4 and amorphous silicon layer 5 are thermally annealed so that the amorphous layer 4 and amorphous silicon layer 5 are converted to monocrystalline material layers under the influence of the monocrystalline silicon substrate. That is, the amorphous layer 4 and amorphous silicon layer 5 are recrystallized. The amorphous silicon layer 5 at both sides of the silicon oxide stripe 2 is integrated with the substrate, which is a preparation for the subsequent formation of the Fin body. The annealing may be implemented in a heating oven or on a heating plate. The annealing temperature is 600-900° C. and the annealing time is 1-8 hours. The annealing is implemented in an oxygen free environment, such as in a hydrogen, nitrogen or vacuum environment. Shown in the upper half of FIG. 4 is a sectional view and shown in the lower half of FIG. 4 is a top view.

Figure 5:
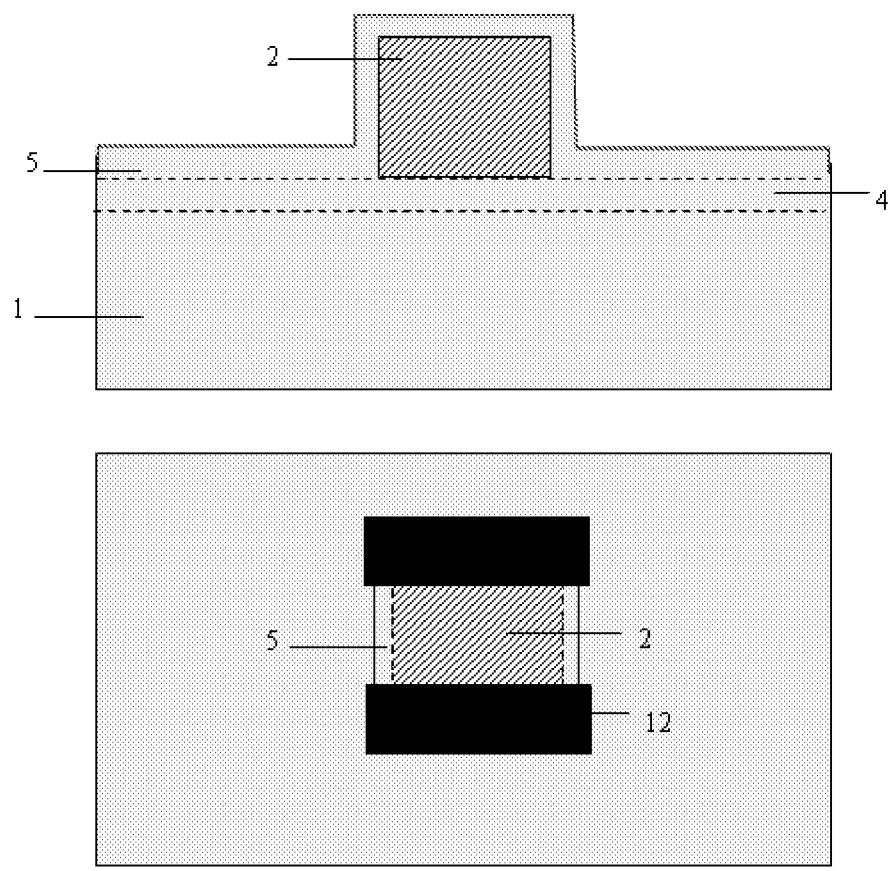
FIG. 5 shows a step of defining source and drain regions of the transistor according to an embodiment of the present invention.

Referring to FIG. 5, a process is implemented on two regions at two ends of the silicon oxide stripe 2, which are predesigned to be source and drain regions of the transistor, so as to form a protective layer. In particular, for photolithography, photoresist covers two regions at two ends of the silicon oxide stripe 2, which are defined as source and drain regions, so as to form a photoresist pattern 12. The photoresist pattern 12 can be used as a protective layer for protecting the covered regions at the two ends of the silicon oxide stripe 2, which are predesigned to be source and drain regions of the transistor, so that the regions can be used as the source and drain regions of the transistor, respectively. Shown in the upper half of FIG. 5 is a sectional view and shown in the lower half of FIG. 5 is a top view.

Figure 6:
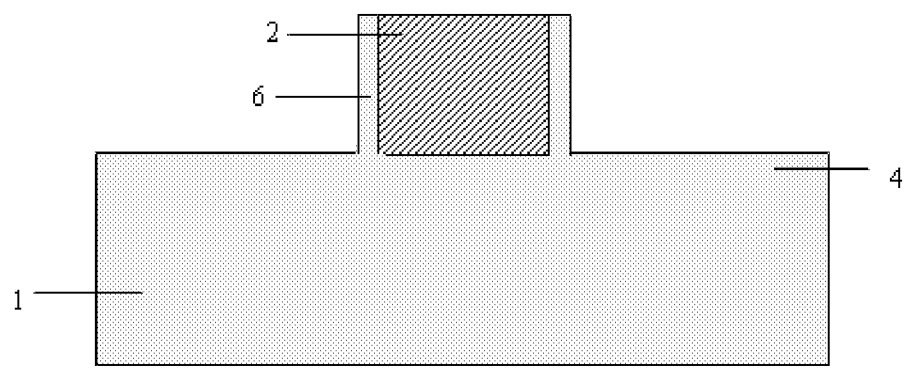
FIG. 6 shows a step of removing the recrystallized semiconductor layer on the top of the substrate and the dielectric stripe according to an embodiment of the present invention.

Referring to FIG. 6, the recrystallized silicon layer 5 is removed from the top surfaces of the substrate 1 and the silicon oxide stripe 2. Recrystallized silicon spacers are formed at two sides of the region of the silicon oxide stripe 2 which is not covered by the protective layer. In particular, the reactive-ion etching (RIE) can be used to anisotropically etch the recrystallized layer on the top surfaces of the silicon wafer 1 and the silicon oxide stripe 2. Due to the anisotropic etching, there leave recrystallized silicon layers at two sides of the silicon oxide stripe 2. That is, the recrystallized silicon spacers are formed at two sides of the silicon oxide stripe 2. And, recrystallized semiconductor blocks are formed at the regions covered by the protective layer. The recrystallized semiconductor blocks formed are source and drain regions of the transistor, respectively, and abut the recrystallized silicon spacers.

Figure 7:
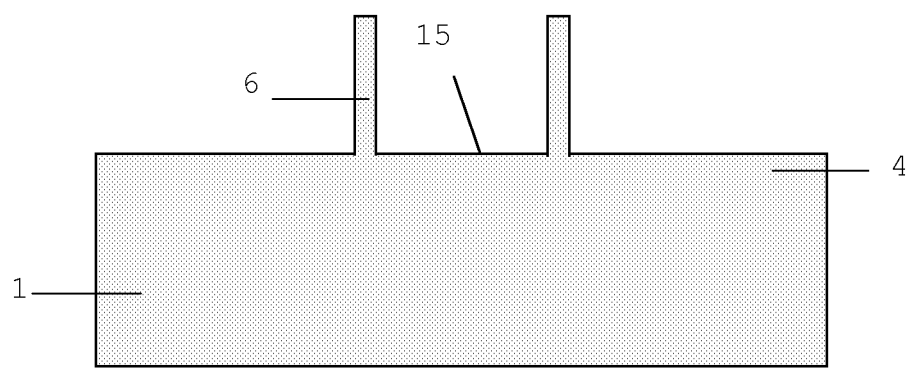
FIG. 7 shows a step of removing the dielectric stripe between the silicon spacers to form Fin bodies according to an embodiment of the present invention.

Referring to FIG. 7, the silicon oxide stripe 2 between the recrystallized silicon spacers is corroded off by using BOE so that the remaining recrystallized silicon spacers construct Fin bodies 6. A Fin body 6 has a rectangle side whose width is the thickness of a Fin body 6. That is, the Fin bodies 6 are formed from processing the amorphous silicon layer 5 at the spacers of the silicon oxide stripe 2. Since the amorphous silicon layer 5 is formed by deposition, the thickness of the Fin bodies 6 can be determined by the deposition process, and can be controlled under the requirements in practice, without restrictions of the photolithography and etching. Furthermore, the recrystallized semiconductor blocks (not shown) abut two sides of the Fin bodies 6 so that the blocks function as support blocks for supporting the Fin bodies, which prevents the deformation or damage of the Fin bodies 6 due to their small thickness. The region between the two Fin bodies 6 is a channel region 15 of the transistor.

Figure 8:
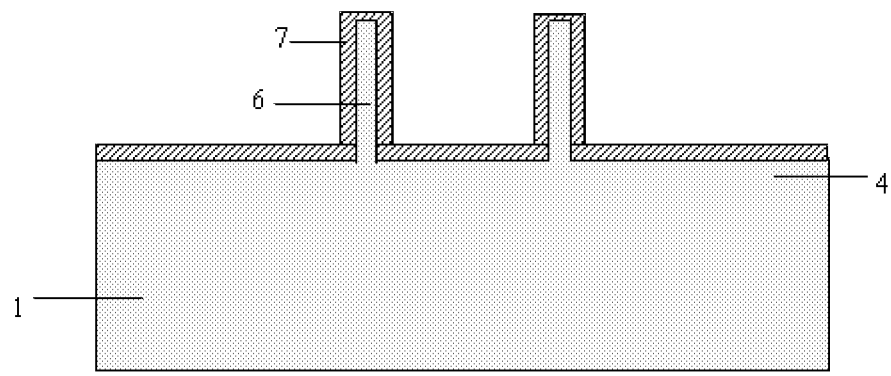
FIG. 8 shows a step of forming a sacrificial layer according to an embodiment of the present invention.

Referring to FIG. 8, a sacrificial layer is formed on the surface of the Fin bodies 6. The sacrificial layer may be a silicon dioxide sacrificial layer 7 with a thickness of 2 nm-5 nm and can be formed by using a process of thermal oxidation. The formed silicon dioxide sacrificial layer 7 also covers the substrate 1 and the recrystallized semiconductor blocks.

Figure 9:
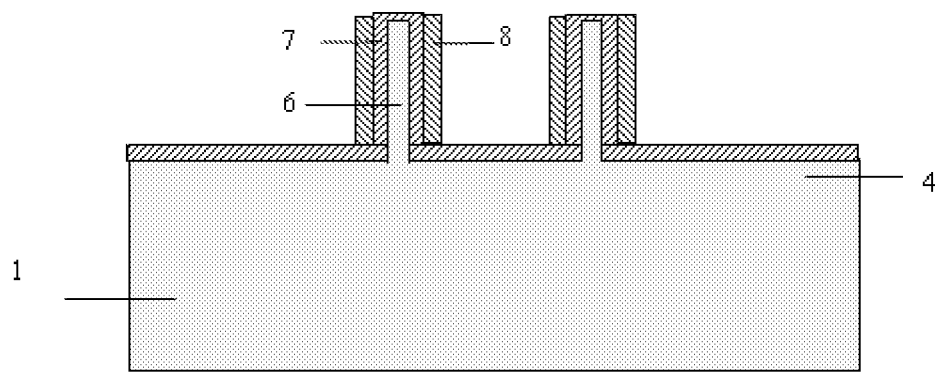
FIG. 9 shows a step of forming protective spacers according to an embodiment of the present invention.

Referring to FIG. 9, a protective film is formed on the silicon dioxide sacrificial layer 7. The protective film is processed to form protective spacers at both sides of the Fin bodies 6. The protective film may be a silicon nitride layer with a thickness of 2 nm-5 nm. The anisotropic dry-etching can be used to process the protective film to form silicon nitride protective spacers 8 at both sides of the Fin bodies 6.

Figure 10:
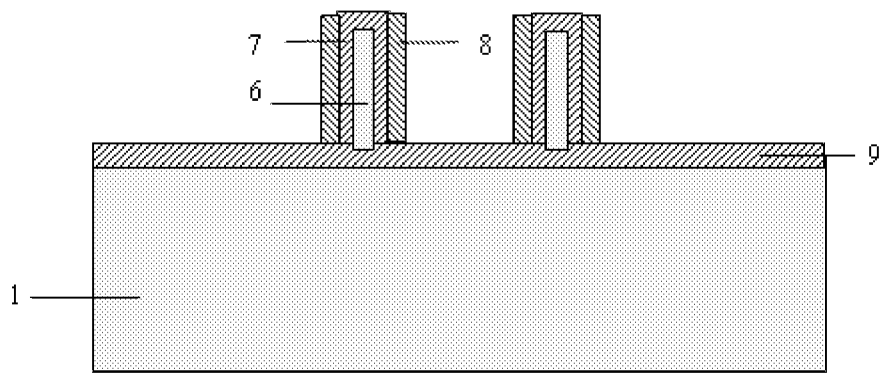
FIG. 10 shows a step of isolating the Fin bodies from the substrate according to an embodiment of the present invention.

Referring to FIG. 10, the device is processed by a lateral oxidation so that the Fin bodies 6 are isolated from the substrate. In particular, the device may be processed by a conventional dry-oxygen thermal oxidation so that the previously formed silicon dioxide sacrificial layer 7 and the regions uncovered by the silicon nitride protective spacers 8 are further oxidized. The resulting silicon oxide 9 has thickness with an additional 30 nm-80 nm. Due to the isotropic thermal oxidation, the silicon material at the bottom of the Fin bodies 6 is also oxidized so that the Fin bodies 6 are isolated by the silicon oxide 9.

Figure 11:
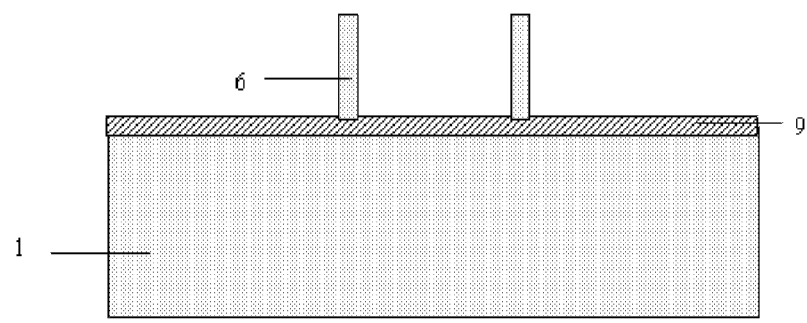
FIG. 11 shows a step of removing the sacrificial layer and the protective spacers according to an embodiment of the present invention.

Referring to FIG. 11, the protective spacers 8 and the silicon dioxide sacrificial layer 7 are removed. The protective spacers 8 may be removed by using wet etching (hot phosphoric acid), and the silicon dioxide sacrificial layer 7 may be removed by using wet etching (BOE).

Figure 12:
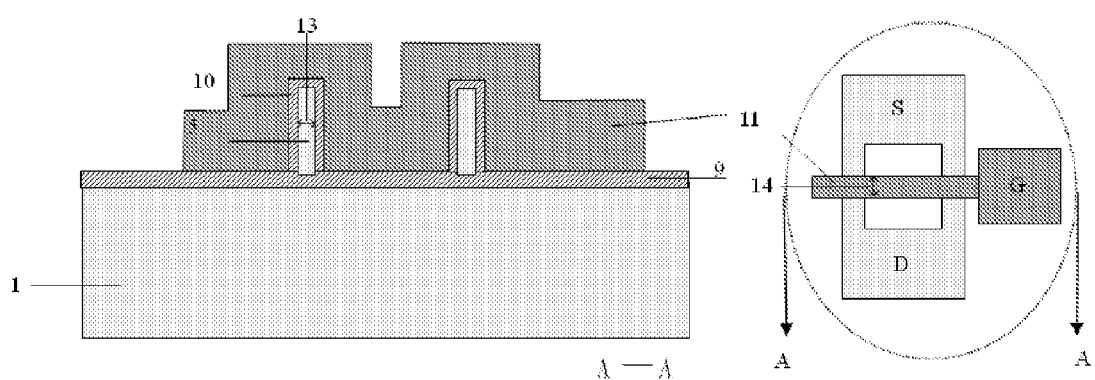
FIG. 12 shows a step of forming a gate dielectric layer and a gate electrode according to an embodiment of the present invention.

Referring to FIG. 12, a gate dielectric layer 10 with a thickness of 0.7 nm-3 nm equivalent to an oxide layer is formed. The thermal oxidation can be used to form a silicon dioxide layer, or a dielectric (such as hafnium oxide and the like) layer with a high K value may be deposited. Then, a gate electrode material (such as polysilicon, Al and the like) layer is deposited. The gate electrode material layer is photolithographied and etched to form a gate electrode 11. Then, a conventional CMOS subsequent process is performed, which includes doping the gate electrode and the source and drain regions, depositing a passivation layer, punching a contact hole, and metallizating etc. Then, a FinFET transistor may be manufactured.

Referring to FIG. 12, the thickness of the Fin bodies 6 in the embodiment refers to the width 13 of the bottom of the Fin bodies 6 on the substrate, and the length of the gate electrode refers to the width 14 of the top surface of the gate electrode.

As described above, the thickness of the Fin body in the embodiment is determined by the deposition process but not restricted by the photolithography and etching. The Fin body may be formed to have a thickness satisfying the requirements of various FinFETs. For example, where a dual-gate FinFET is manufactured by using the method, it is easy to control the thickness of the Fin body 6 to be ⅓-½ of the length of the gate electrode or shorter.

Embodiment 2

The step of implanting ions to form the amorphous layer 4 by using the dielectric stripe 2 as a mask (referring to FIG. 2) and the step of forming the amorphous semiconductor layer 5 (referring to FIG. 3) in the Embodiment 1 can be exchanged with each other. The detailed are as follows.

Referring to FIG. 1, a dielectric layer, which may be a silicon oxide layer and have a thickness of 100 nm-300 nm, is formed on a substrate 1. The substrate 1 may be a silicon wafer substrate. The silicon oxide layer may be formed by conventional thermal oxidation, chemical vapor deposition (CVD), physical vapor deposition (PVD) and the like. Then, the dielectric layer is processed to form a dielectric strip. For example, the dielectric layer may be processed by photolithography and dry-etching so as to form a silicon oxide strip 2. The thickness of the silicon oxide strip 2 may be much lager than the length of a gate electrode without needing any specific fine processing. According to the present invention, a substitute of an equivalent can be taken by the skilled in the art for the silicon oxide stripe 2 of the embodiment. In addition, another process other than the photolithography and dry-etching can be used for forming the silicon oxide stripe 2.

Figure 13:
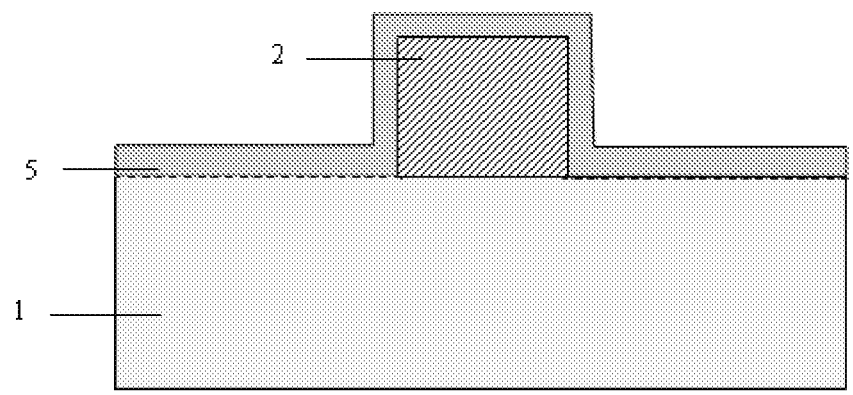
FIG. 13 shows a step of forming an amorphous semiconductor layer according to another embodiment of the present invention.

Referring to FIG. 13, an amorphous semiconductor layer covering the silicon oxide stripe 2 is formed on the substrate 1. The amorphous semiconductor layer may be the amorphous silicon layer 5 which may be formed by low pressure chemical vapor deposition (LPCVD).

Figure 14:
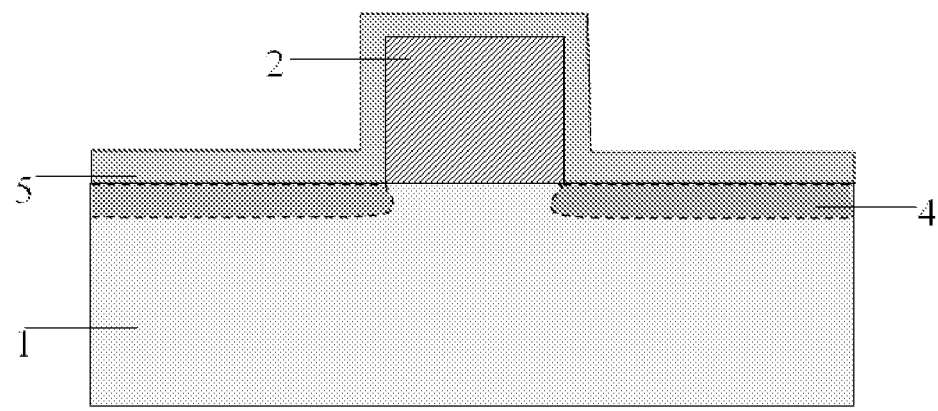
FIG. 14 shows a step of implanting ions to the substrate to form an amorphous layer according to the other embodiment of the present invention.

Referring to FIG. 14, ions corresponding to the substrate material are implanted by using the silicon oxide stripe 2 as a mask, so that an amorphous layer 4 is formed at the previously monocrystalline surface of the substrate. In the embodiment, the ions for implantation may be silicon ions or germanium ions. In particular, silicon or germanium ions with a concentration of $1\times10^{15}$ cm$^{-2}$ are inclinedly and symmetrically implanted into the regions at both sides of the silicon oxide stripe 2 with the silicon oxide stripe 2 being used as a mask. The inclining angle for implantation is ±15°. The implantation energy depends from the thickness of the amorphous layer 5. The interface between the surface layer (i.e. the amorphous layer 4) of the substrate 1 and the amorphous layer 5 has the peak of the concentration of the impurity to be doped.

Referring to FIG. 4, the resulting device is thermally annealed so that the amorphous layer 4 and amorphous silicon layer 5 are converted to monocrystalline material layers under the influence of the monocrystalline silicon substrate. That is, the amorphous layer 4 and amorphous silicon layer 5 are recrystallized. The amorphous silicon layer 5 at both sides of the silicon oxide stripe 2 is integrated with the substrate. The annealing may be implemented in a heating oven or on a heating plate. The annealing temperature is 600-900° C. and the annealing time is 1-8 hours. The annealing is implemented in an oxygen free environment, such as in a hydrogen, nitrogen or vacuum environment. Shown in the upper half of FIG. 4 is a sectional view and shown in the lower half of FIG. 4 is a top view.

Referring to FIG. 5, a process is implemented on two regions at two ends of the silicon oxide stripe 2, which are predesigned to be source and drain regions of the transistor, so as to form a protective layer. In particular, for photolithography, photoresist covers two regions at two ends of the silicon oxide stripe 2, which are defined as source and drain regions, so as to form a photoresist pattern 12. The photoresist pattern 12 can be used as a protective layer for protecting the covered regions at the two ends of the silicon oxide stripe 2, which are predesigned to be source and drain regions of the transistor, so that the regions can be used as the source and drain regions of the transistor, respectively. Shown in the upper half of FIG. 5 is a sectional view and shown in the lower half of FIG. 5 is a top view.

Referring to FIG. 6, the recrystallized silicon layer 5 is removed from the top surfaces of the substrate 1 and the silicon oxide stripe 2. Recrystallized silicon spacers are formed at two sides of the region of the silicon oxide stripe 2 which is not covered by the protective layer. In particular, the reactive-ion etching (RIE) can be used to anisotropically etch the recrystallized layer on the top surfaces of the silicon wafer 1 and the silicon oxide stripe 2. Due to the anisotropic etching, there leave recrystallized silicon layers at two sides of the silicon oxide stripe 2. That is, the recrystallized silicon spacers are formed at two sides of the silicon oxide stripe 2. And, recrystallized semiconductor blocks are formed at the regions covered by the protective layer. The recrystallized semiconductor blocks formed are source and drain regions of the transistor, respectively, and abut the recrystallized silicon spacers.

Referring to FIG. 7, the silicon oxide stripe 2 between the recrystallized silicon spacers is corroded off by using BOE so that the remaining recrystallized silicon spacers construct Fin bodies 6. A Fin body 6 has a rectangle side whose width is the thickness of a Fin body 6. That is, the thickness of the Fin bodies 6 can be determined by the deposition process, and can be controlled under the requirements in practice, without restrictions of the photolithography and etching. Furthermore, the recrystallized semiconductor blocks abut two sides of the Fin bodies 6 so that the blocks function as support blocks for supporting the Fin bodies, which prevents the deformation or damage of the Fin bodies 6 due to their small thickness. The region between the Fin bodies 6 is a channel region of the transistor.

Referring to FIG. 8, a sacrificial layer is formed on the surface of the Fin bodies 6. The sacrificial layer may be a silicon dioxide sacrificial layer 7 with a thickness of 2 nm-5 nm and can be formed by using a process of thermal oxidation. The formed silicon dioxide sacrificial layer 7 also covers the substrate 1 and the recrystallized semiconductor blocks.

Referring to FIG. 9, a protective film is formed on the silicon dioxide sacrificial layer 7. The protective film is processed to form protective spacers at both sides of the Fin bodies 6. The protective film may be a silicon nitride layer with a thickness of 2 nm-5 nm. The anisotropic dry-etching can be used to process the protective film to form silicon nitride protective spacers 8 at both sides of the Fin bodies 6.

Referring to FIG. 10, the device is processed by a lateral oxidation so that the Fin bodies 6 are isolated from the substrate. In particular, the device may be processed by a conventional dry-oxygen thermal oxidation so that the previously formed silicon dioxide sacrificial layer 7 and the regions uncovered by the silicon nitride protective spacers 8 are further oxidized. The resulting silicon oxide 9 has thickness with an additional 30 nm-80 nm. Due to the isotropic thermal oxidation, the silicon material at the bottom of the Fin bodies 6 is also oxidized so that the Fin bodies 6 are isolated by the silicon oxide 9.

Referring to FIG. 11, the protective spacers 8 and the silicon dioxide sacrificial layer 7 are removed. The protective spacers 8 may be removed by using wet etching (hot phosphoric acid), and the silicon dioxide sacrificial layer 7 may be removed by using wet etching (BOE).

Referring to FIG. 12, a gate dielectric layer 10 with a thickness of 0.7 nm-3 nm equivalent to an oxide layer is formed. The thermal oxidation can be used to form a silicon dioxide layer, or a dielectric (such as hafnium oxide and the like) layer with a high K value may be deposited. Then, a gate electrode material (such as polysilicon, Al and the like) layer is deposited. The gate electrode material layer is photolithographied and etched to form a gate electrode 11. Then, a conventional CMOS subsequent process is performed, which includes doping the gate electrode and the source and drain regions, depositing a passivation layer, punching a contact hole, and metallizating etc. Then, a FinFET transistor may be manufactured.

As described above, the thickness of the Fin body in the present invention is determined by the deposition process but not restricted by the photolithography and etching. Especially, the method is suitable for manufacturing the transistor which needs a fine Fin body. Furthermore, since the Fin body according to the present invention is formed by deposition, the uniformity of the thickness and morphology of the Fin body can be improved significantly.

It is noted that the present invention is not limited to the above embodiments. Without departing the concept of the present invention, simple deduction or substitution made by the skilled in the art should be within the protection scope of the present invention.

The invention claimed is:

1. A method for manufacturing a Fin-type field effect transistor (FinFET) device, comprising:
    forming a dielectric stripe on a monocrystalline substrate;
    implanting ions to the substrate by using the dielectric stripe as a mask so as to convert a surface layer of the substrate from a monocrystalline material to an amorphous layer;
    forming an amorphous semiconductor layer on the substrate, which covers the dielectric stripe, and then recrystallizing each of the amorphous layer and the amorphous semiconductor layer to be a recrystallized semiconductor layer by thermal annealing;
    processing regions beside two ends of the dielectric stripe to form a protective layer, the regions being predesigned as source and drain regions;
    forming recrystallized semiconductor spacers at two sides of the dielectric stripe uncovered by the protective layer, and forming recrystallized semiconductor blocks on regions covered by the protective layer;
    removing the dielectric stripe between the spacers so that the spacers can be formed as Fin bodies, the semiconductor blocks being support blocks on two sides of the Fin bodies and the support blocks being the source and drain regions of a transistor;
    forming a sacrificial layer on the substrate and the semiconductor blocks, forming protective spacers on two sides of each of the Fin bodies, and then isolating the Fin bodies from the substrate by oxidizing; and
    removing the protective spacers and forming a gate dielectric layer and a gate electrode.

2. The method according to claim 1, wherein the amorphous semiconductor layer covering the dielectric stripe is formed by deposition.

3. The method according to claim 1, wherein the substrate is an un-doped monocrystalline semiconductor substrate.

4. The method according to claim 1, wherein the semiconductor spacers are formed by:
    anisotropically etching the recrystallized semiconductor layer so as to form the recrystallized semiconductor spacers at two sides of the dielectric stripe uncovered by the protective layer.

5. The method according to claim 1, wherein the sacrificial layer formed on the surface covers the Fin bodies, and the method further comprises removing the sacrificial layer on two sides of each of Fin bodies after the step of removing the protective spacers.

6. The method according to claim 1, wherein the step of isolating the Fin bodies from the substrate comprises forming an isolation layer at the bottom of each Fin body by lateral oxidation so as to isolate the Fin bodies from the substrate.

7. The method according to claim 1, wherein the step of processing regions beside two ends of the dielectric stripe to form a protective layer comprises covering a photoresist onto the regions beside two ends of the dielectric stripe, which are predesigned as source and drain regions.

8. The method according to claim 1, wherein the annealing is performed in an oxygen free environment for a time of 1 hour-8 hours at a temperature of 600° C.-900° C.

9. The method according to claim 8, further comprising forming a shield layer on the substrate, after the step of forming a dielectric stripe on a substrate and before the step of implanting impurity ions.

10. The method according to claim 1, wherein the dielectric stripe is a silicon oxide stripe and the amorphous semiconductor layer is an amorphous silicon layer.

11. A method for manufacturing a Fin-type field effect transistor (FinFET) device, comprising:
    forming a dielectric stripe on a monocrystalline substrate;
    forming an amorphous semiconductor layer on the substrate, which covers the dielectric stripe;
    implanting ions to the substrate by using the dielectric stripe as a mask so as to form an amorphous layer on the substrate, and then recrystallizing each of the amorphous layer and the amorphous semiconductor layer to be a recrystallized semiconductor layer by thermal annealing;
    processing regions beside two ends of the dielectric stripe to form a protective layer, the regions being predesigned as source and drain regions;
    forming recrystallized semiconductor spacers at two sides of the dielectric stripe uncovered by the protective layer, and forming recrystallized semiconductor blocks on regions covered by the protective layer;
    removing the dielectric stripe between the spacers so that the spacers can be formed as Fin bodies, the semiconductor blocks being support blocks on two sides of the Fin bodies and the support blocks being the source and drain regions of a transistor;
    forming a sacrificial layer on the substrate and the semiconductor blocks, forming protective spacers on two sides of each of the Fin bodies, and then isolating the Fin bodies from the substrate by oxidizing; and
    removing the protective spacers and forming a gate dielectric layer and a gate electrode.

12. The method according to claim 11, wherein the amorphous semiconductor layer covering the dielectric stripe is formed by deposition.

\* \* \* \* \*